(12) United States Patent
Hasegawa et al.

(10) Patent No.: US 7,500,512 B2
(45) Date of Patent: Mar. 10, 2009

(54) COOLING STRUCTURE FOR HIGH TENSION ELECTRICAL EQUIPMENT

(75) Inventors: Osamu Hasegawa, Utsunomiya (JP);
Kazuhiko Aitaka, Utsunomiya (JP);
Harumi Takedomi, Utsunomiya (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 396 days.

(21) Appl. No.: 11/300,427

(22) Filed: Dec. 15, 2005

(65) Prior Publication Data

US 2006/0090877 A1 May 4, 2006

Related U.S. Application Data

(63) Continuation of application No. 10/254,768, filed on Sep. 26, 2002, now Pat. No. 7,004,233.

(30) Foreign Application Priority Data

Oct. 5, 2001 (JP) ............... 2001-310602

(51) Int. Cl.
*B60H 1/00* (2006.01)
(52) U.S. Cl. .................... 165/41; 165/47
(58) Field of Classification Search ............ 165/47, 165/104.33, 41, 96, 122, 80.3; 361/690, 361/694, 695; 62/259.2; 454/228, 236, 184, 454/267, 309, 49
See application file for complete search history.

(56) References Cited

U.S. PATENT DOCUMENTS

| 4,605,160 A | 8/1986 | Day |
| 4,887,522 A | 12/1989 | Kuno et al. |
| 5,559,673 A | 9/1996 | Gagnon et al. |
| 5,773,755 A | 6/1998 | Iwatare |
| 5,793,610 A | 8/1998 | Schmitt et al. |
| 5,890,959 A | 4/1999 | Pettit et al. |
| 5,979,540 A | 11/1999 | Allison et al. |

(Continued)

FOREIGN PATENT DOCUMENTS

JP 56-138378 10/1981

(Continued)

OTHER PUBLICATIONS

Bednarz et al.; "Plastics in Electrical Engineering and Electronic"; Kolhammer, Stuttgart 1988, ISBN 3-17-009351-7, p. 280 to 287.

*Primary Examiner*—Ljiljana (Lil) V Ciric
(74) *Attorney, Agent, or Firm*—Arent Fox LLP

(57) ABSTRACT

The present invention aims to cool high tension electrical equipment efficiently with a small, lightweight device. The high tension electrical equipment cooling structure is provided for cooling batteries which supply electricity to the operating motor via an inverter, and the inverter using cooling air, and comprises an equipment box for guiding cooling air introduced from a cooling air inlet port into a cooling air outlet port, and a fan for introducing cooling air from the cooling air inlet port. A shutter that consists of an elastic material is disposed inside the intake duct. The shutter closes off the cooling air flow path, and when negative pressure is generated downstream of the shutter due to the operation of the fan, the shutter undergoes elastic deformation, and as a result, the cooling air flow path is opened.

5 Claims, 14 Drawing Sheets

U.S. PATENT DOCUMENTS

| | | | |
|---|---|---|---|
| 6,011,689 | A | 1/2000 | Wrycraft |
| 6,094,927 | A | 8/2000 | Anazawa et al. |
| 6,134,108 | A | 10/2000 | Patel et al. |
| 6,135,875 | A | 10/2000 | French |
| 6,174,232 | B1 | 1/2001 | Stoll et al. |
| 6,181,557 | B1 | 1/2001 | Gatti |
| 6,427,454 | B1 | 8/2002 | West |
| 6,466,440 | B2 | 10/2002 | Kaneko |
| 2001/0026887 | A1 | 10/2001 | Minamiura et al. |

FOREIGN PATENT DOCUMENTS

| | | |
|---|---|---|
| JP | 6-60204 | 8/1994 |
| JP | 11-89014 | 3/1999 |
| JP | 11-180169 | 7/1999 |
| JP | 11-195437 | 7/1999 |
| JP | 2000-059917 | 2/2000 |
| JP | 2001-018664 | 1/2001 |
| JP | 2001-163065 | 6/2001 |

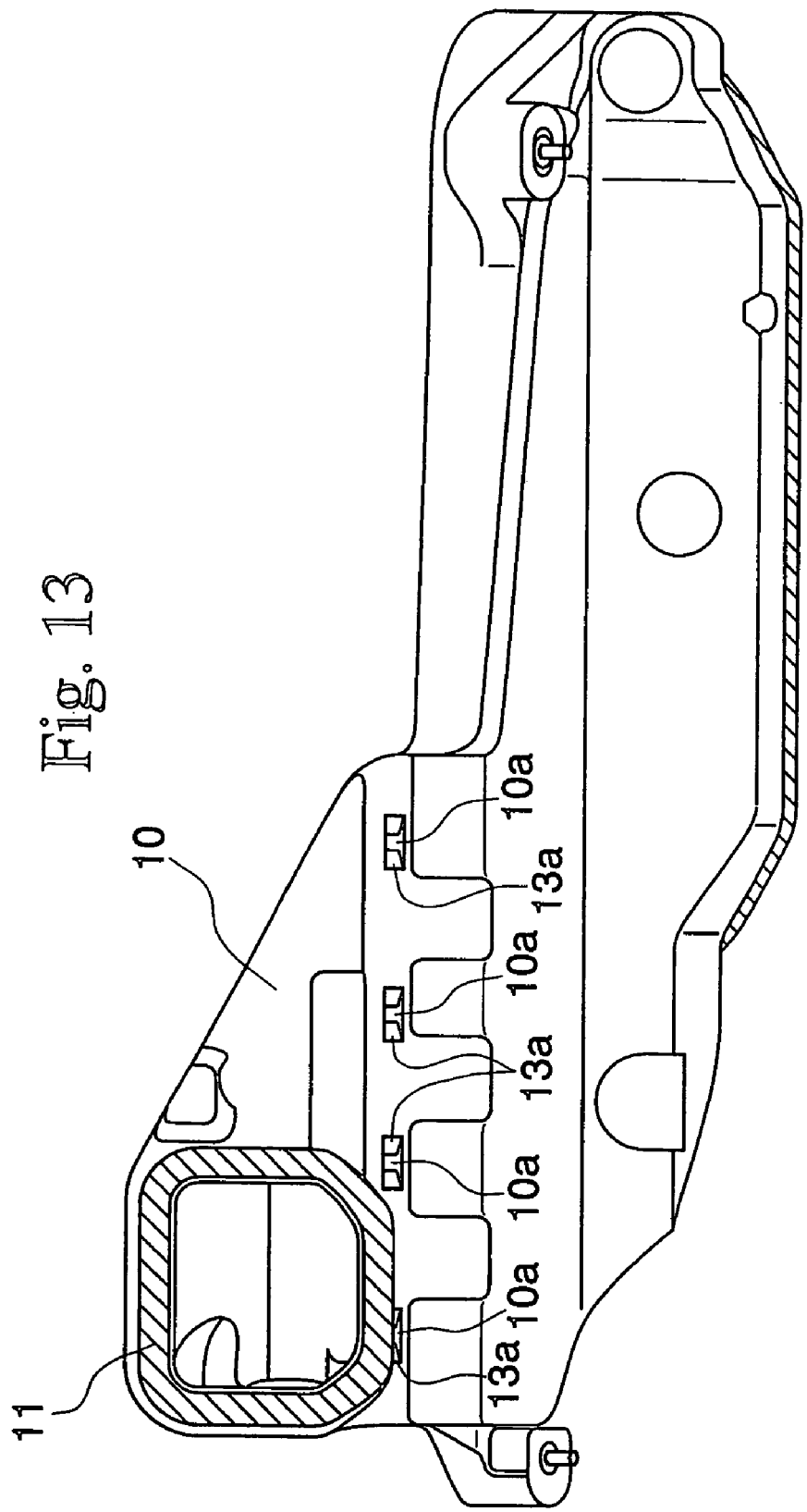

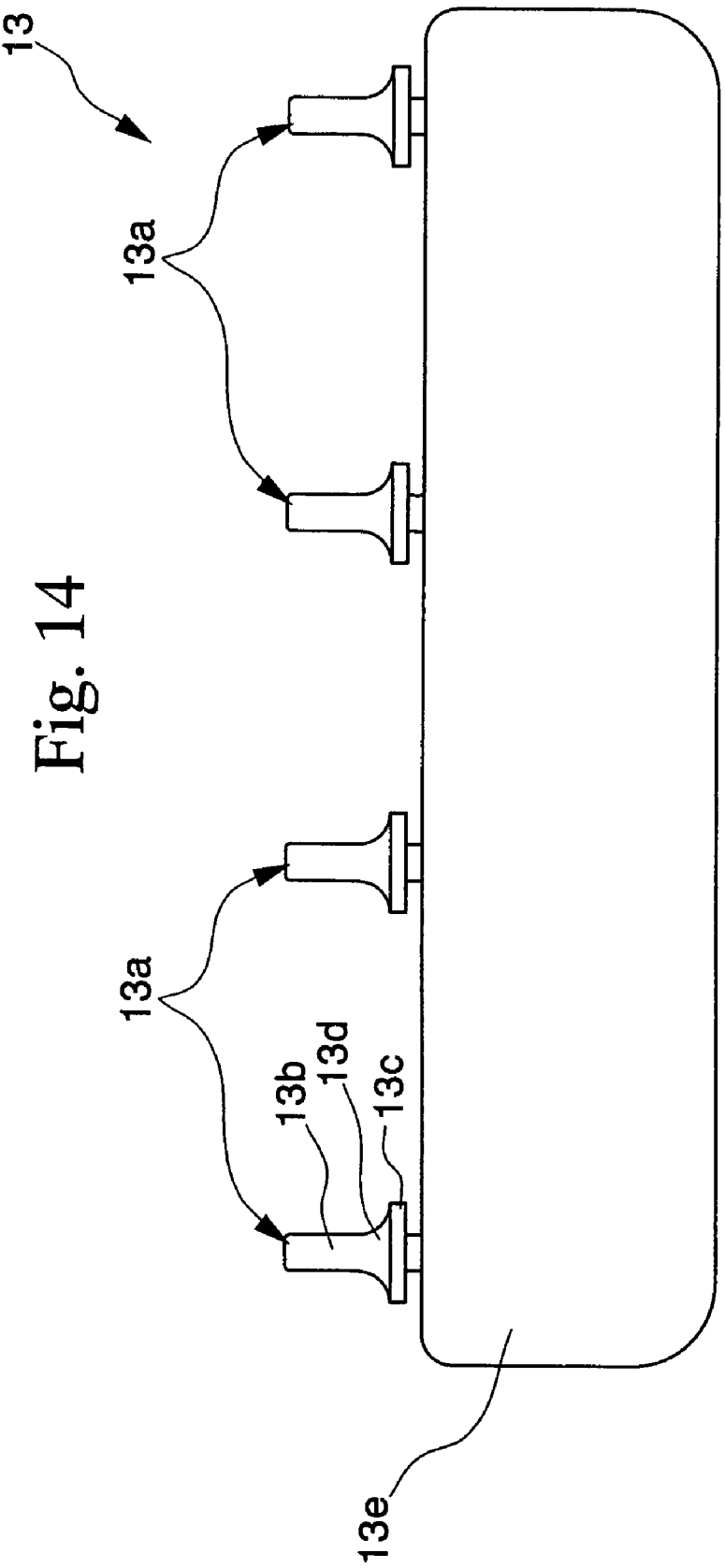

COOLING STRUCTURE FOR HIGH TENSION ELECTRICAL EQUIPMENT

CROSS-REFERENCE TO RELATED APPLICATION

This application is a Continuation Application which claims the benefit of U.S. patent application Ser. No. 10/254,768, filed Sep. 26, 2002 now U.S. Pat. No. 7,004,233, which in turn claims priority to foreign application no. 2001-310602, filed May 10, 2001 in Japan. The disclosures of the prior applications are hereby incorporated by reference herein in their entirety.

BACKGROUND OF THE INVENTION

1. Field of the Invention

The present invention relates to a cooling device for high tension electrical equipment, like condensers or inverters, that are installed in vehicles provided with a generator motor that rotates the vehicle's drive shaft, such as in hybrid and electric vehicles, for example.

2. Description of the Related Art

Cooling devices, such as the vehicular electrical equipment cooling device disclosed in Japanese Patent Application, First Publication No. Hei 11-195437 for example, are conventionally known that cool a battery or other such high tension electrical equipment by operating a cooling fan that takes in air from inside the vehicle via ducts that have intake ports communicating with the inside of the vehicle, and using this interior air from the vehicle to cool the high tension electrical equipment such as a battery.

However, the temperature of the battery or other high tension electrical equipment can increase considerably in conventional cooling devices such as described above. Namely, the temperature inside the vehicle can become very high when the vehicle has been stopped for a long period of time during the summer, for example. Since the duct intake ports communicate with the interior of the vehicle, this high-temperature air inside the vehicle can enter into and flow through the ducts even when the cooling fan is off, potentially increasing the temperature of the equipment excessively.

In response to this type of problem, such approaches have been considered as increasing the length of the duct, to prevent the high-temperature air inside the vehicle from reaching the high tension electrical equipment when the cooling fan is off. However, this type of cooling device leads to an increase in the size and weight of the device, increasing costs required for forming its structure.

SUMMARY OF THE INVENTION

The present invention was conceived in view of the above-described circumstances and has as its objective the provision of a cooling device for high tension electrical equipment which is compact, lightweight, and can efficiently cool the high tension electrical equipment.

In order to achieve the objectives for resolving the problems described above, the present invention provides a high tension electrical equipment cooling device which cools the high tension electrical equipment (a battery 5, inverter 7 and DC/DC converter in the embodiment which follows) using cooling air, this device being provided with an equipment box (such as equipment box 70 in the embodiment described below) in which cooling air introduced from an intake duct (such as intake duct 10 in the embodiment described below) which has a cooling air intake port (such as cooling air inlet port 11 in the embodiment described below) is guided to an exhaust duct (such as exhaust duct 40 in the embodiment below) which has a cooling air exhaust port (such as cooling air exhaust port 41 described in the embodiments below, for example); a fan (such as fan 60 described in the embodiment below, for example) which introduces the cooling air from the cooling air intake port; and an opening/closing valve (such as shutter 13 described in the embodiment below, for example) for opening and closing the intake duct; wherein the opening/closing valve consists of an elastic material, and the intake duct is opened by the flow of cooling air from inside the intake duct during operation of the fan.

In the high tension electrical equipment cooling device as described above, when cooling air flow is forced through the equipment box by the fan, this cooling air flow opens the opening/closing valve. In other words, when the cooling air hits the opening/closing valve which is closing off the intake duct, the wind pressure of this cooling air opens the cooling air flow path by elastically deforming the opening/closing valve, which consists of an elastic material for example, or by revolving the opening/closing valve around a suitable rotational axis.

Since the opening/closing action of the opening/closing valve is linked to the operation of the fan, the intake duct can be maintained in the closed state when the fan is not running. For example, even when the temperature of the air inside the vehicle has risen, the hot air inside the vehicle can be prevented from entering the equipment box.

As a result, by means of a simple and inexpensive structure in which an opening/closing valve consisting of an elastic material is provided inside the intake duct, it is possible to efficiently cool the high tension electrical equipment.

In this high tension electrical equipment cooling device, the intake duct may consist of a foaming resin.

In this high tension electrical equipment cooling device, the thermoinsulating properties are improved by forming the intake duct from this foaming resin, and the device can be made lighter in weight as well. In addition, a greater degree of freedom with respect to form is conferred during production as compared to the case where the intake duct is formed by blow molding, etc.

BRIEF DESCRIPTION OF THE DRAWINGS

FIG. 13 is a planar view of the vicinity of the air intake duct in the high tension electrical equipment cooling device shown in FIG. 2 as seen from a position facing the cooling air intake port.

FIG. 14 is a side view of the shutter.

DESCRIPTION OF THE PREFERRED EMBODIMENTS

A first embodiment of a high tension electrical equipment cooling device of the present invention will now be explained with reference to FIGS. 1 through 10. Note that the vehicle in this embodiment is a hybrid vehicle in which, when power is supplied to the motor from the battery which is a direct current electric source, it is converted from direct current to alternating current by the inverter, and, when a portion of the engine output or the vehicle's kinetic energy is stored in the battery, the power is converted from an alternating current to a direct current by the inverter. Since the direct current voltage converted by the inverter is high voltage, a portion of it is reduced in voltage using a DC/DC converter. The high tension electrical equipment cooling device 1 according to this embodiment cools batteries, inverters and DC/DC converters.

Figure 1:
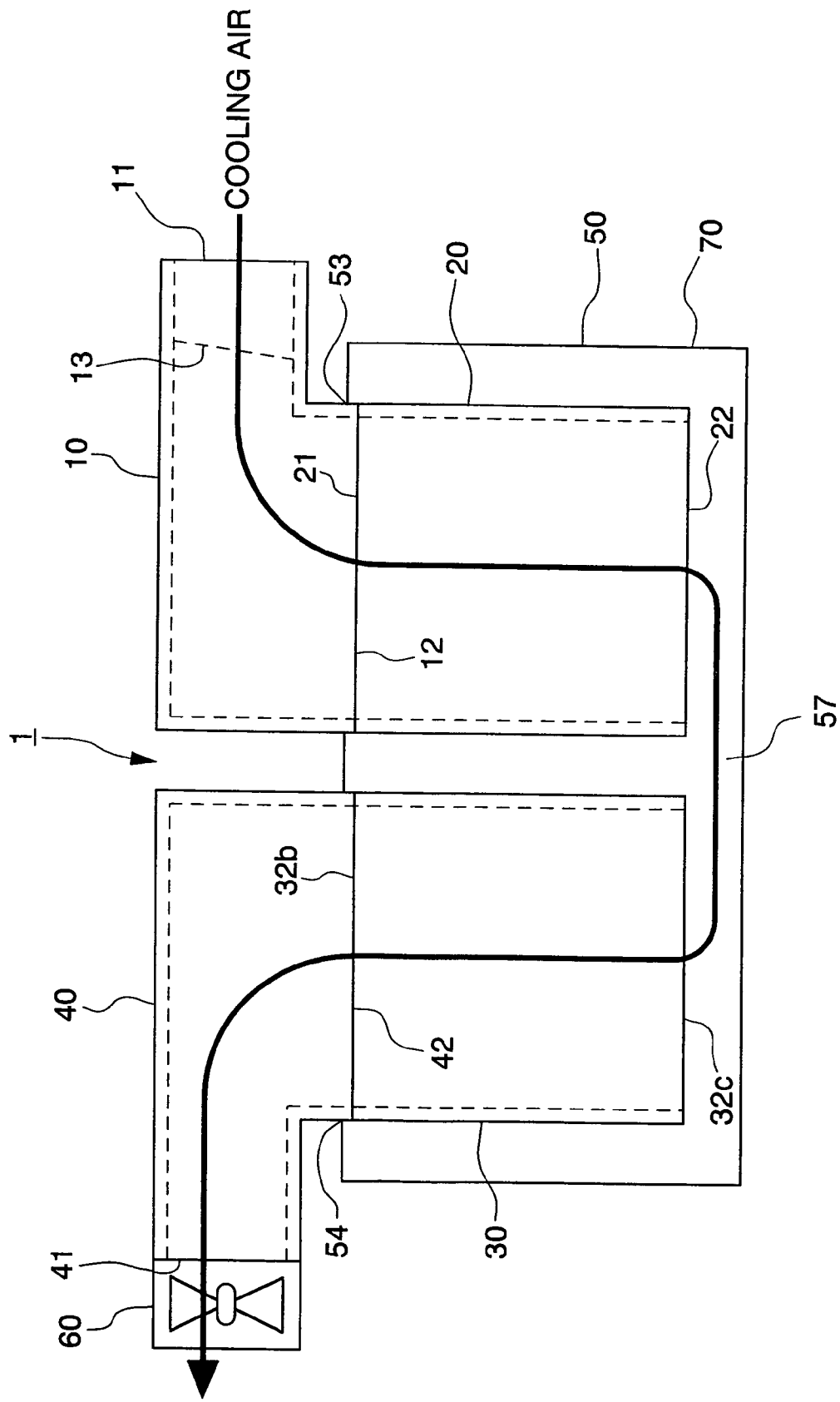
FIG. 1 is a schematic view of a first embodiment of the cooling structure for high tension electrical equipment according to the present invention.

An overview of the high tension electrical equipment cooling device 1 in this embodiment will now be explained with reference to the schematic drawing shown in FIG. 1.

The high tension electrical equipment cooling device 1 is provided with an intake duct 10, battery box 20, heat sink case 30, exhaust duct 40, outer box 50, and fan 60.

The intake duct 10 has a cooling air inlet port 11 that is opened and closed by a shutter 13. The battery box 20 is in the shape of a box, and a upper opening 21 of the battery box 20 is connected to a lower opening 12 of the intake duct 10. A battery (not shown in FIG. 1) is attached inside the battery box 20, and is structured to permit the flow of cooling air. The heat sink case 30 is also in the form of a box, and a upper opening 32*b* of the heat sink case is connected to a lower opening 42 of the exhaust duct 40. A heat sink is provided inside the heat sink case 30, and is structured to permit the flow of cooling air. Furthermore, an inverter and a DC/DC converter (neither of which are shown in FIG. 1) are provided to the outer surface of the heat sink case 30.

The battery box 20, heat sink case 30, inverter, and DC/DC converter are surrounded by the outer box 50. The outer box 50 is a sealed box which has openings 53, 54 in its top. One of these openings, the opening 53, is connected in a sealed state to the connecting portion between the lower opening 12 of the intake duct 10 and the upper opening 21 of the battery box 20. The other opening, the opening 54, is connected in a sealed state to the connecting portion between the lower opening 42 of the exhaust duct 40 and the upper opening 32*b* of the heat sink case 30. In addition, the space inside the outer box 50 creates a communication between the lower opening 22 of the battery box 20 and the lower opening 32*c* of the heat sink case 30.

The exhaust duct 40 has a cooling air outlet 41. A fan 60 is provided to this cooling air outlet 41. The fan 60 and the shutter 13 are structured to operate together. That is, when the fan 60 rotates, the shutter 13 opens, and when the fan 60 stops, the shutter 13 closes. The battery box 20, heat sink case 30, and outer box 50 form a equipment box 70.

In the high tension electrical equipment cooling device 1 having this structure, the shutter 13 opens when the fan 60 rotates, and cooling air is introduced into the intake duct 10 from the cooling air inlet port 11. The cooling air introduced into the intake duct 10 passes through the battery box 20 from the intake duct 10, and is expelled inside the outer box 50. When cooling air passes through the battery box 20, heat exchange with the battery is carried out, so that the battery is cooled as a result. The cooling air is expelled into the outer box 50 after only a slight increase in its temperature. Note that the maintenance temperature of the battery is low, so that it is sufficient for cooling the inverter and DC/DC converter, even if the temperature of the cooling air increases due to battery cooling.

Since the outer box 50 is a sealed box, cooling air expelled into the outer box 50 is introduced into the heat sink case 30. In other words, the inside of the outer box 50 forms a cooling air flow path 57 which directs the cooling air that has cooled the battery to the inverter. The cooling air guided into the heat sink case 30, passes through the heat sink case 30 and is expelled into the exhaust duct 40. Furthermore, this cooling air is taken up by the fan 60 after passing through the cooling air exhaust port 41, and is then expelled to the outside. In addition, when the cooling air passes through the heat sink case 30, heat exchange with the heat sink occurs. The heat from the inverter and the DC/DC converter is communicated to the heat sink via the heat sink case 30. As a result of the heat exchange between the cooling air and the heat sink, the inverter and the DC/DC converter are cooled.

In this way, in this high tension electrical equipment cooling device 1, consideration has been given to the fact that the temperature of the inverter and the DC/DC converter are higher than the maintenance temperature of the battery. The inverter and the DC/DC converter are cooled with cooling air that has already cooled the battery, enabling the efficient cooling of the battery, inverter and the DC/DC converter using low energy (a small amount of cooling energy).

Furthermore, since the battery, inverter, and DC/DC converter are housed within a single equipment box 70, and cooled by the flow of cooling air through the equipment box 70, this structure can be made smaller and lighter than in the case where a plurality of cooling devices are provided for separately cooling each element.

In addition, since cooling air is force blown by the fan 60, it is possible to cool the battery, inverter and DC/DC converter with certainty. Moreover, since a single fan 60 is sufficient, the device can be made smaller and lighter in weight.

Next, the cooling device for high tension electrical equipment according to this embodiment will be explained concretely with reference to FIGS. 2 through 14.

Figure 2:
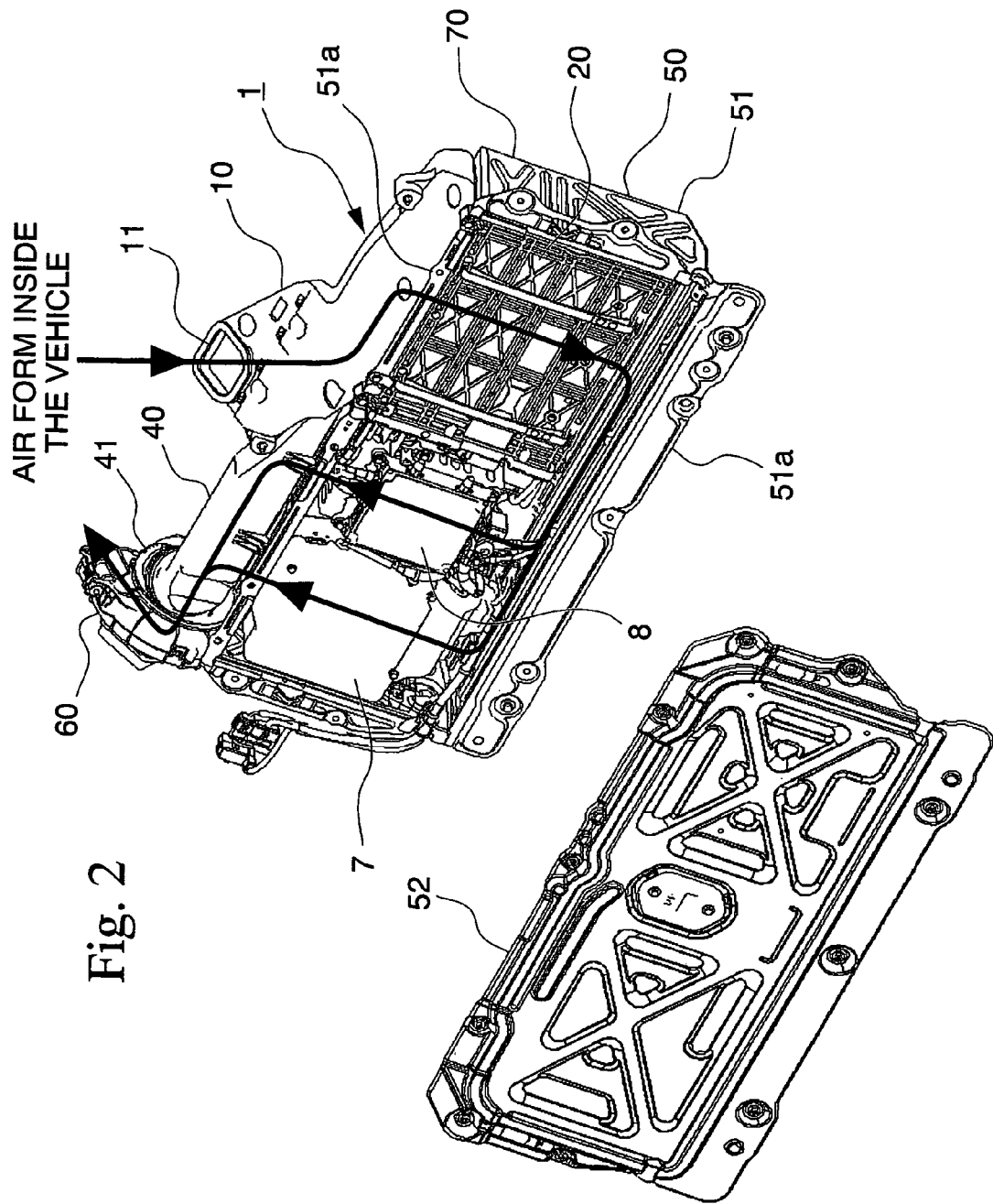
FIG. 2 is a disassembled diagonal perspective showing the high tension electrical equipment cooling device according to this embodiment, as seen from the front of the vehicle.
Figure 3:
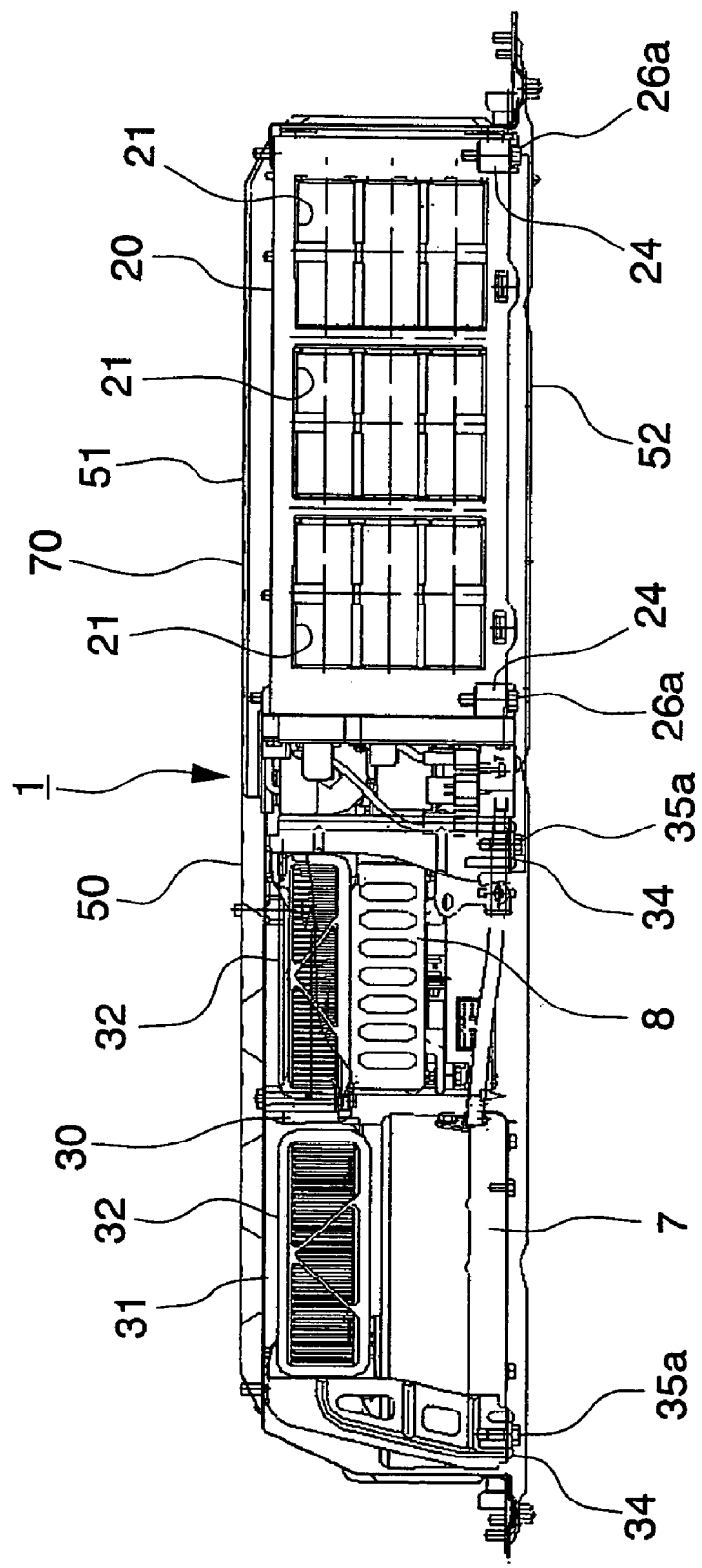
FIG. 3 is a cross-sectional view of the high tension electrical equipment cooling device according to this embodiment.
Figure 4:
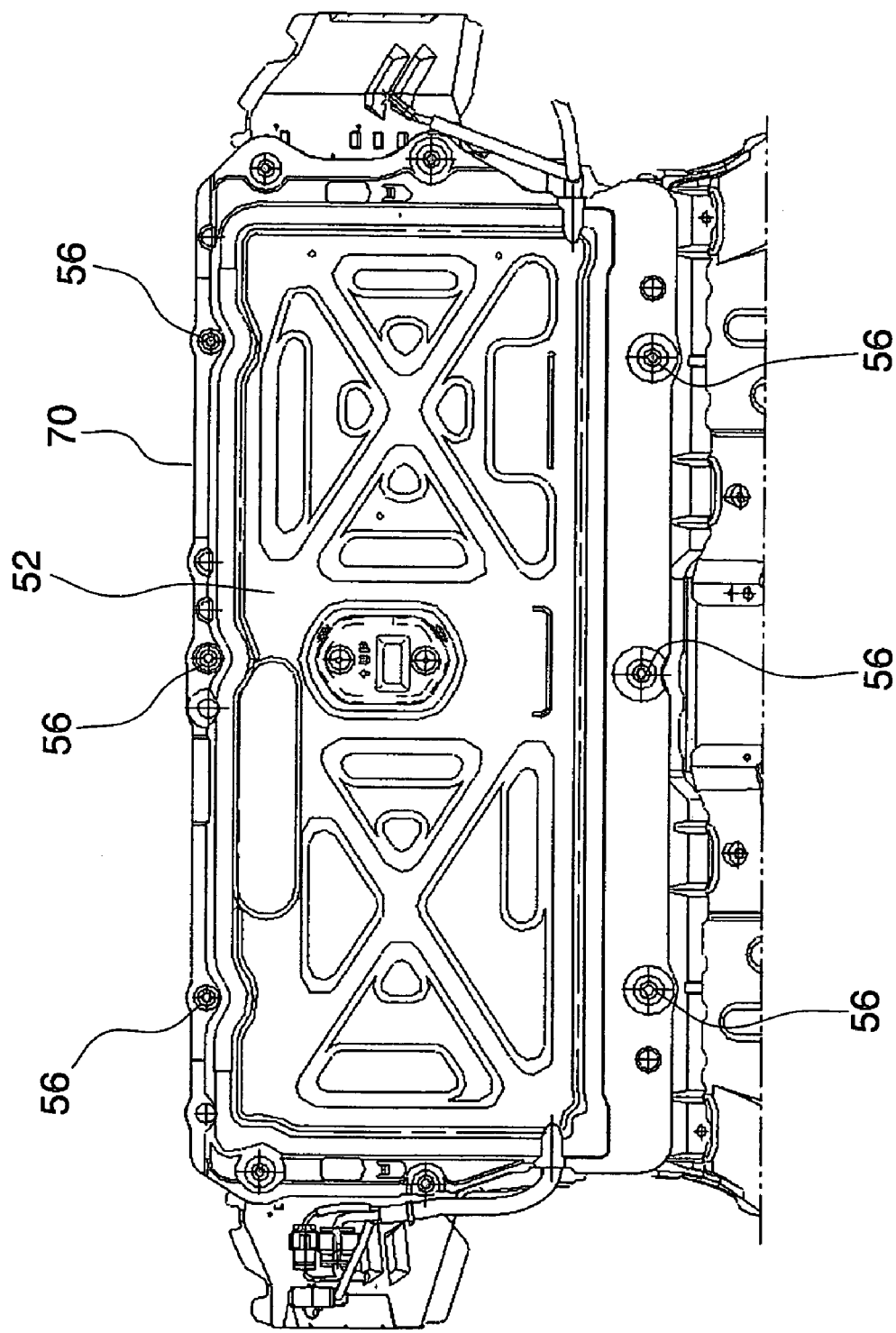
FIG. 4 is a front view of the high tension electrical equipment cooling device according to this embodiment, as seen from the front of the vehicle.
Figure 5:
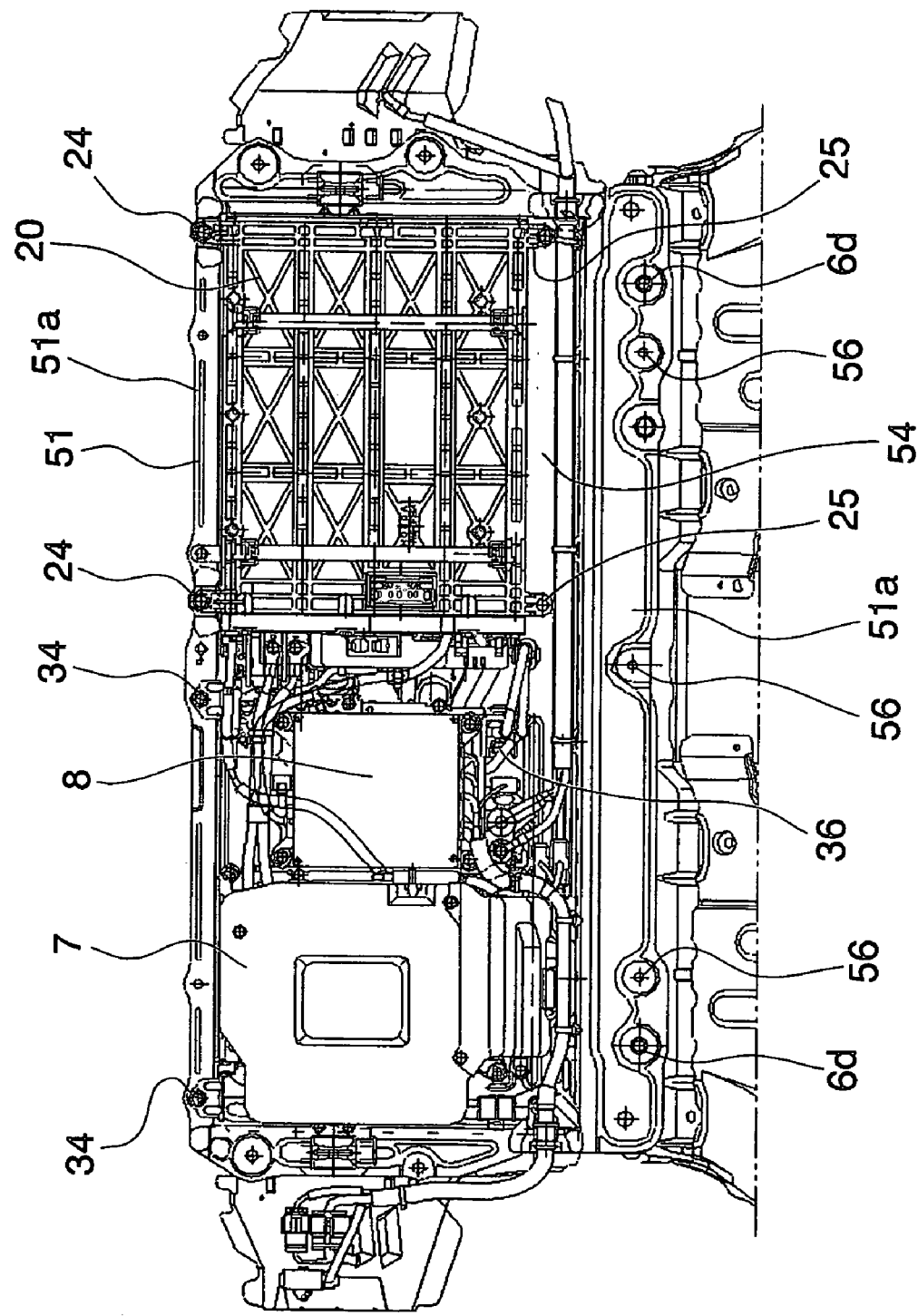
FIG. 5 is a front view of the high tension electrical equipment cooling device according to this embodiment, with a portion of the structure removed, as seen from the front of the vehicle.
Figure 6:
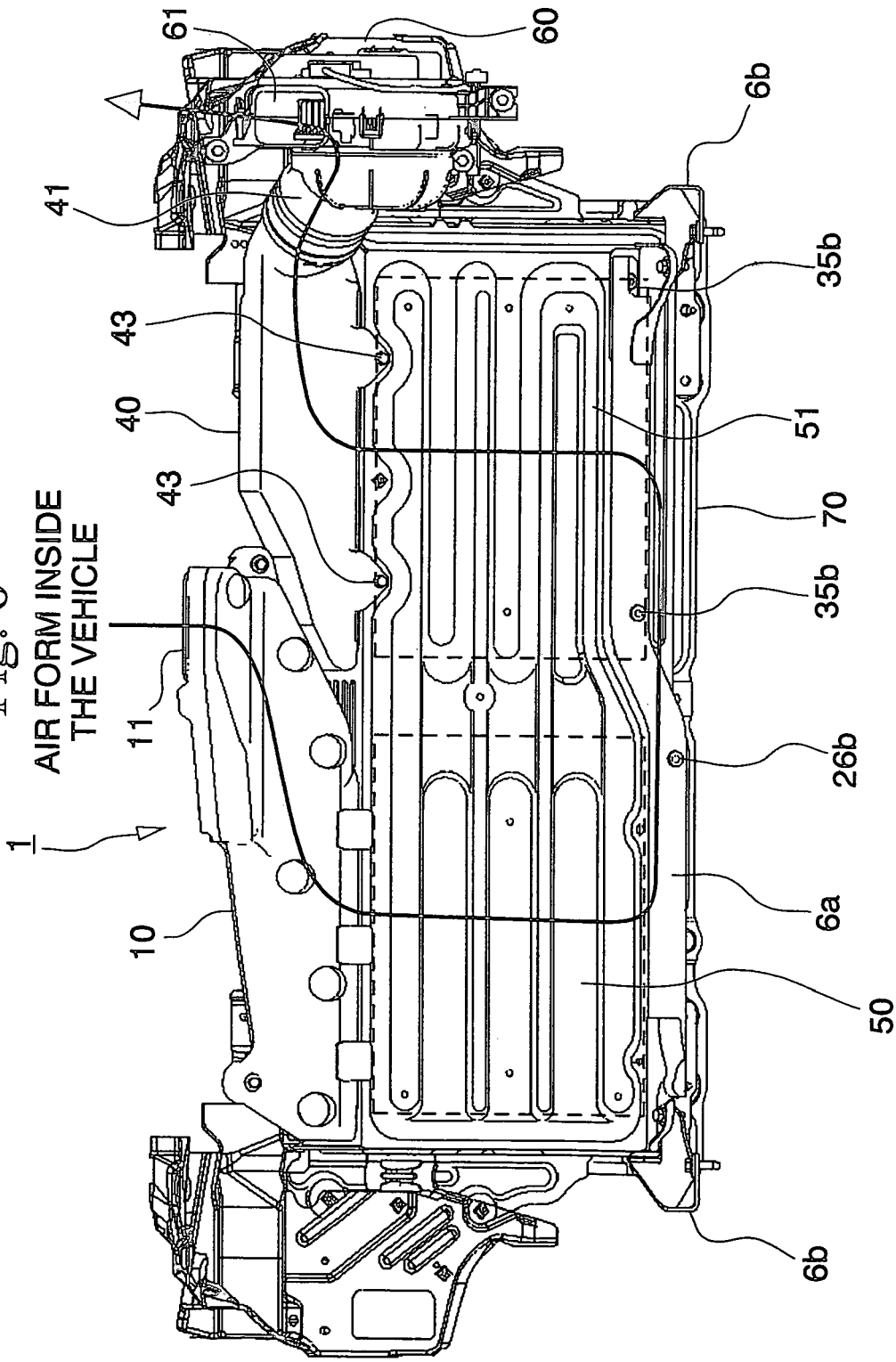
FIG. 6 is a rear view of the high tension electrical equipment cooling device according to this embodiment, as seen from the rear of a vehicle.
Figure 7:
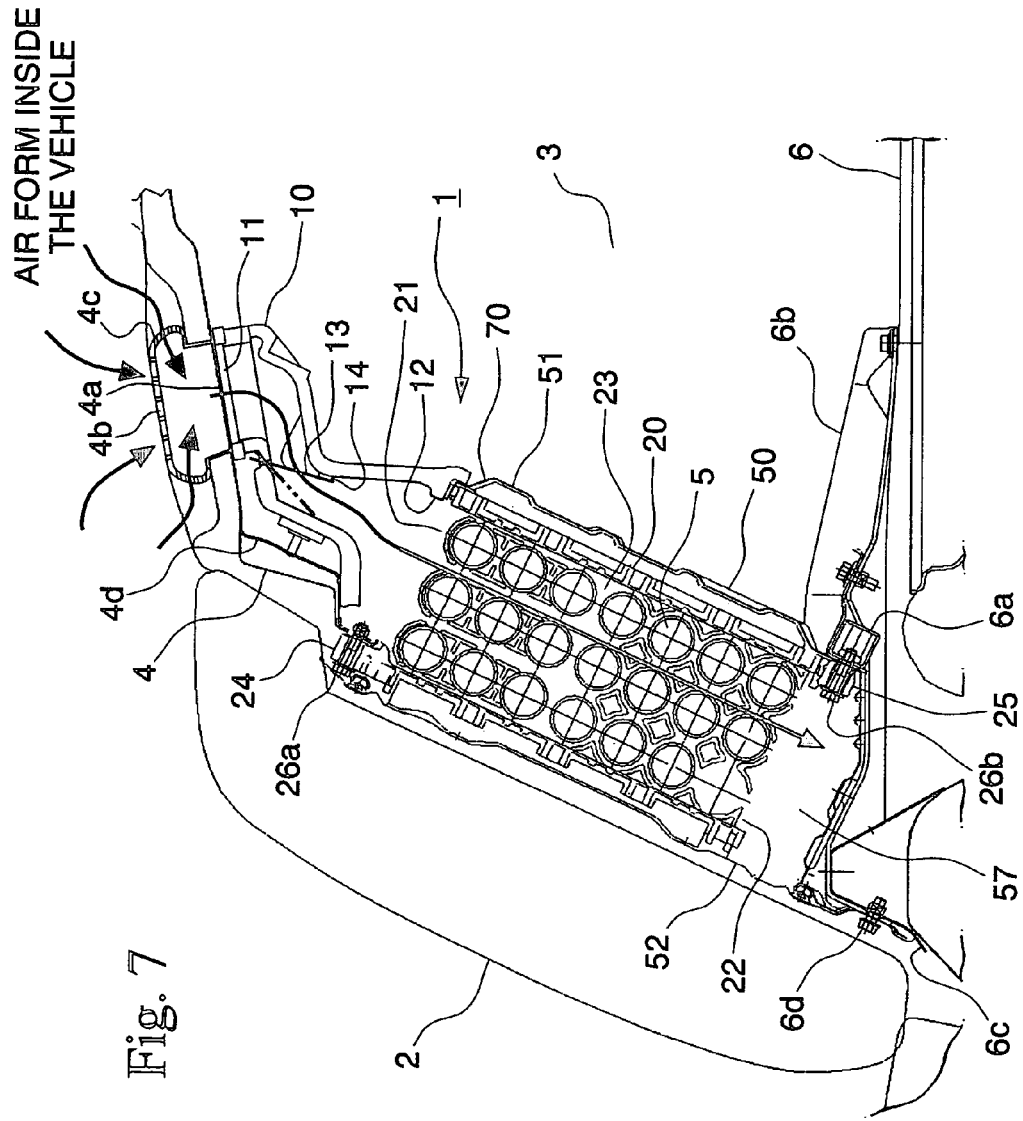
FIG. 7 is a vertical cross-section through the battery housing portion in the high tension electrical equipment cooling device according to this embodiment.
Figure 8:
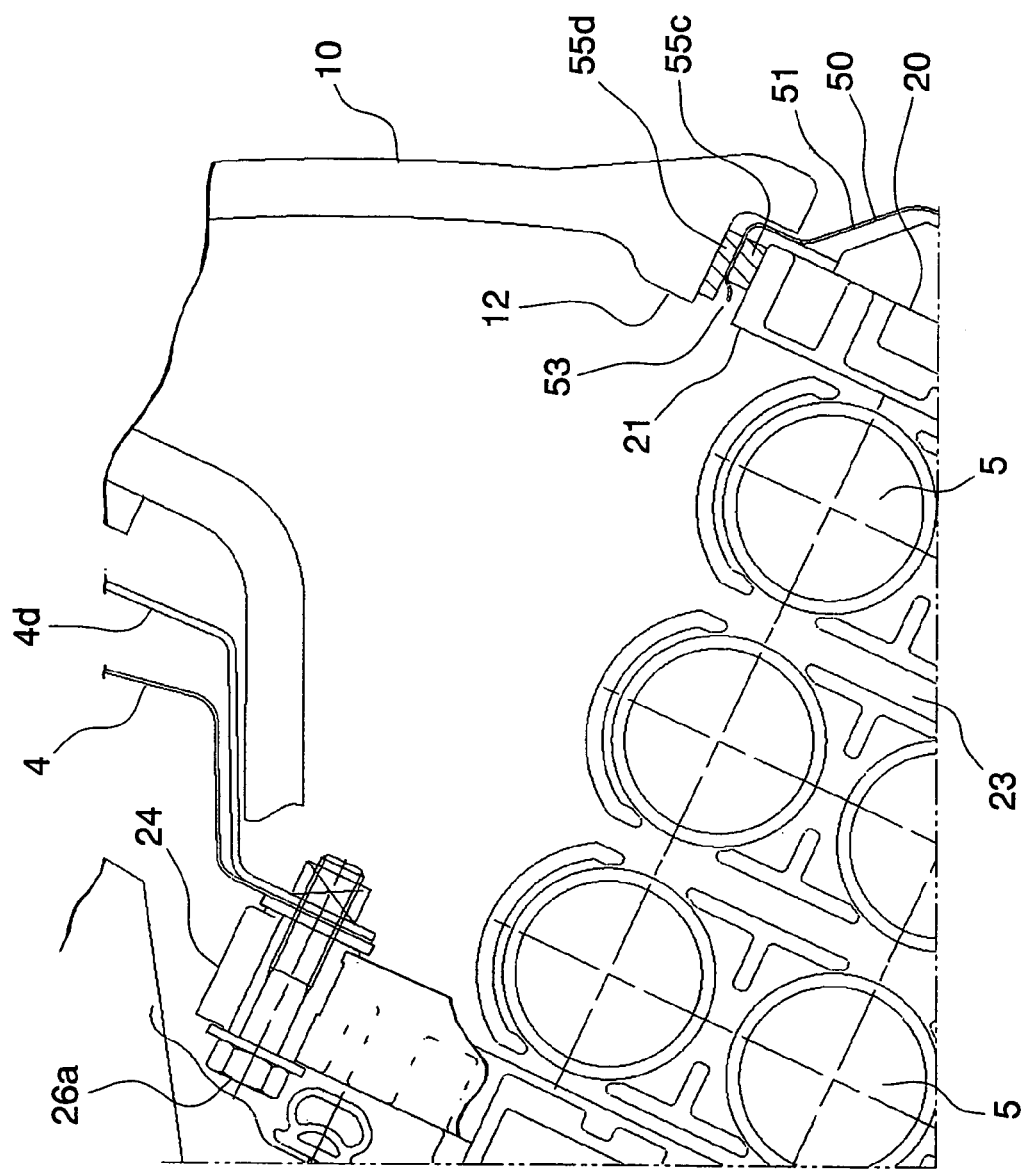
FIG. 8 is an enlarged view of the main components shown in FIG. 7.
Figure 9:
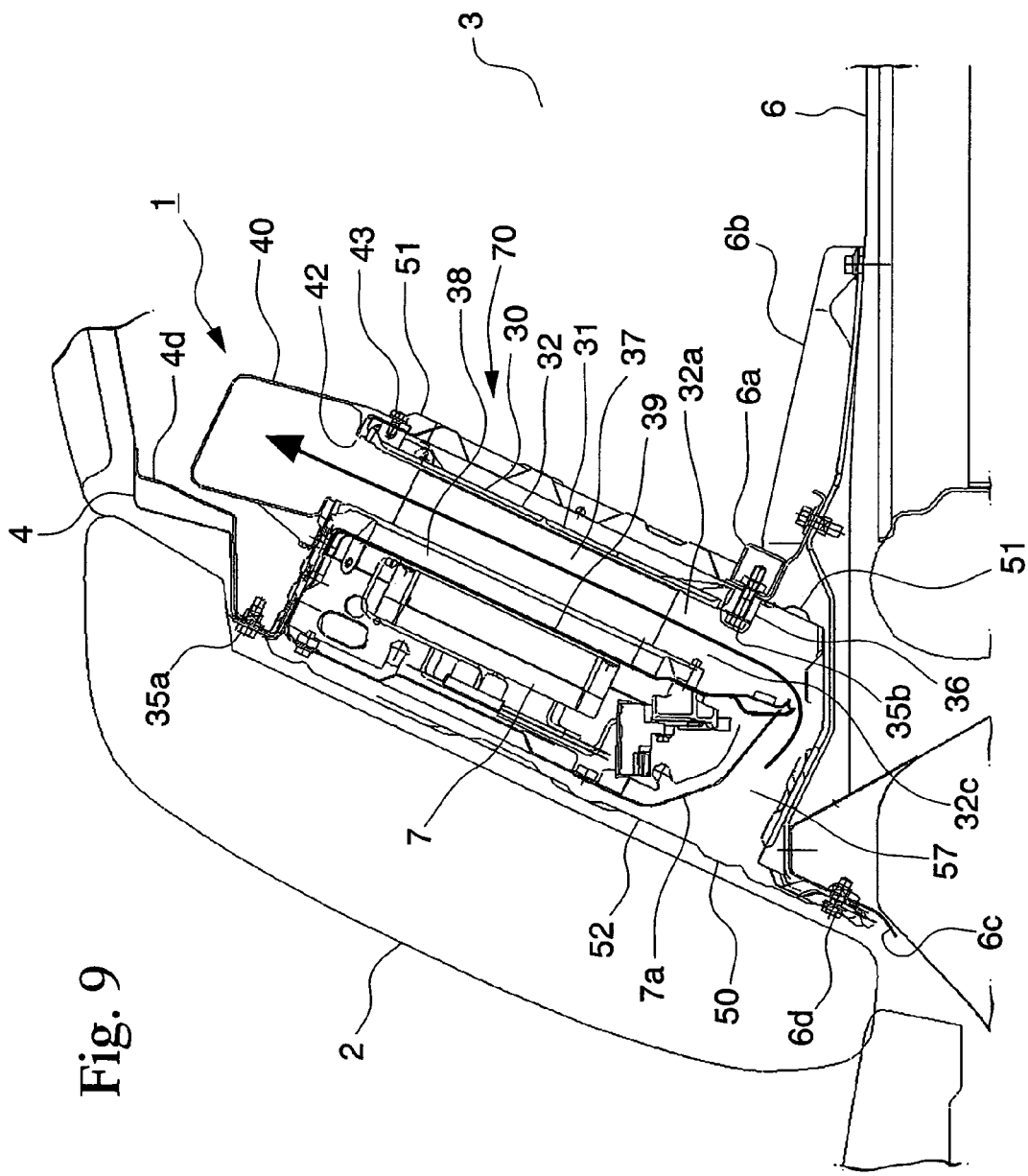
FIG. 9 is vertical cross-sectional view through the inverter housing portion in the high tension electrical equipment cooling device according to this embodiments.
Figure 10:
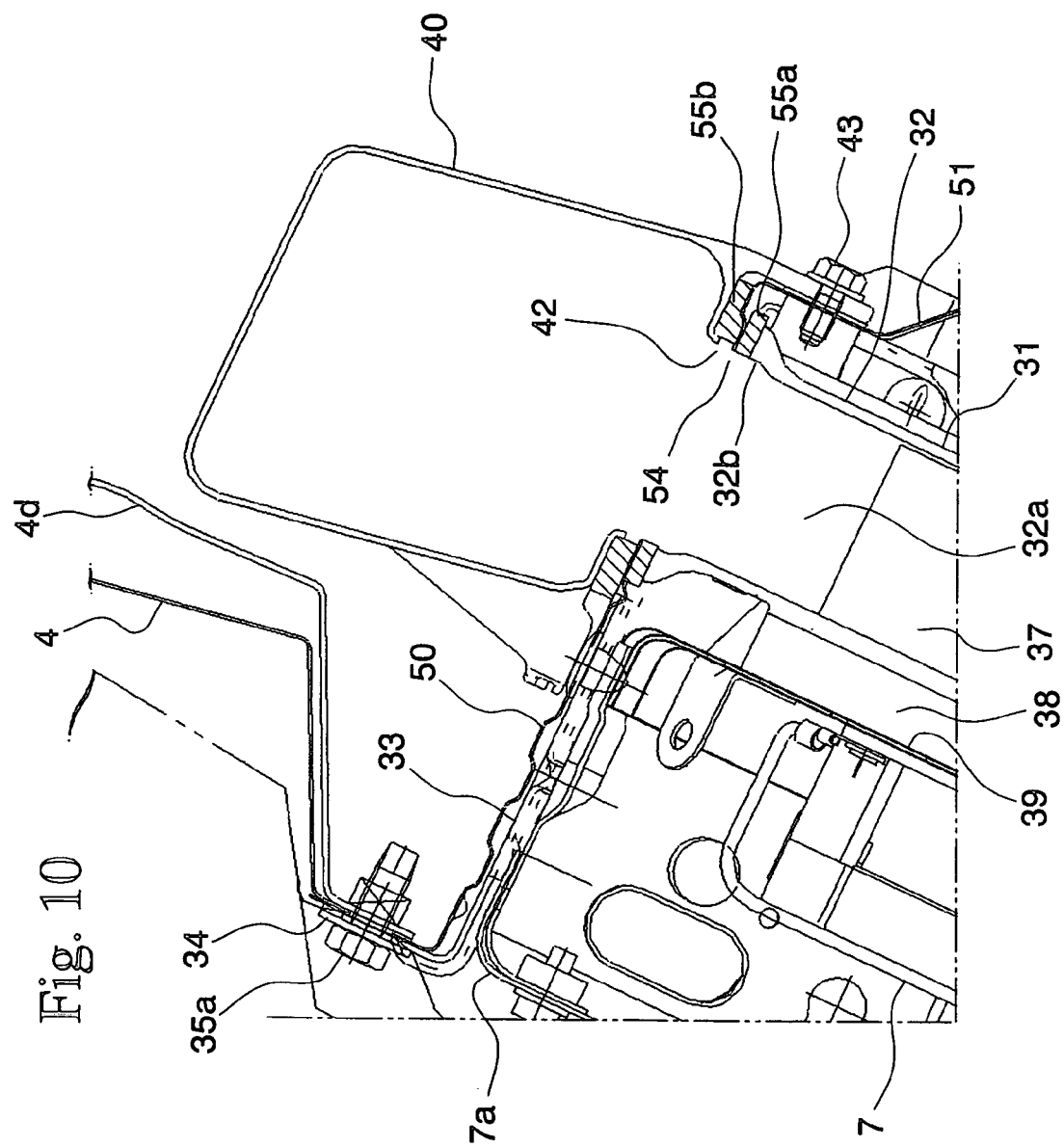
FIG. 10 is an enlarged view of the main components shown in FIG. 9.
Figure 11:
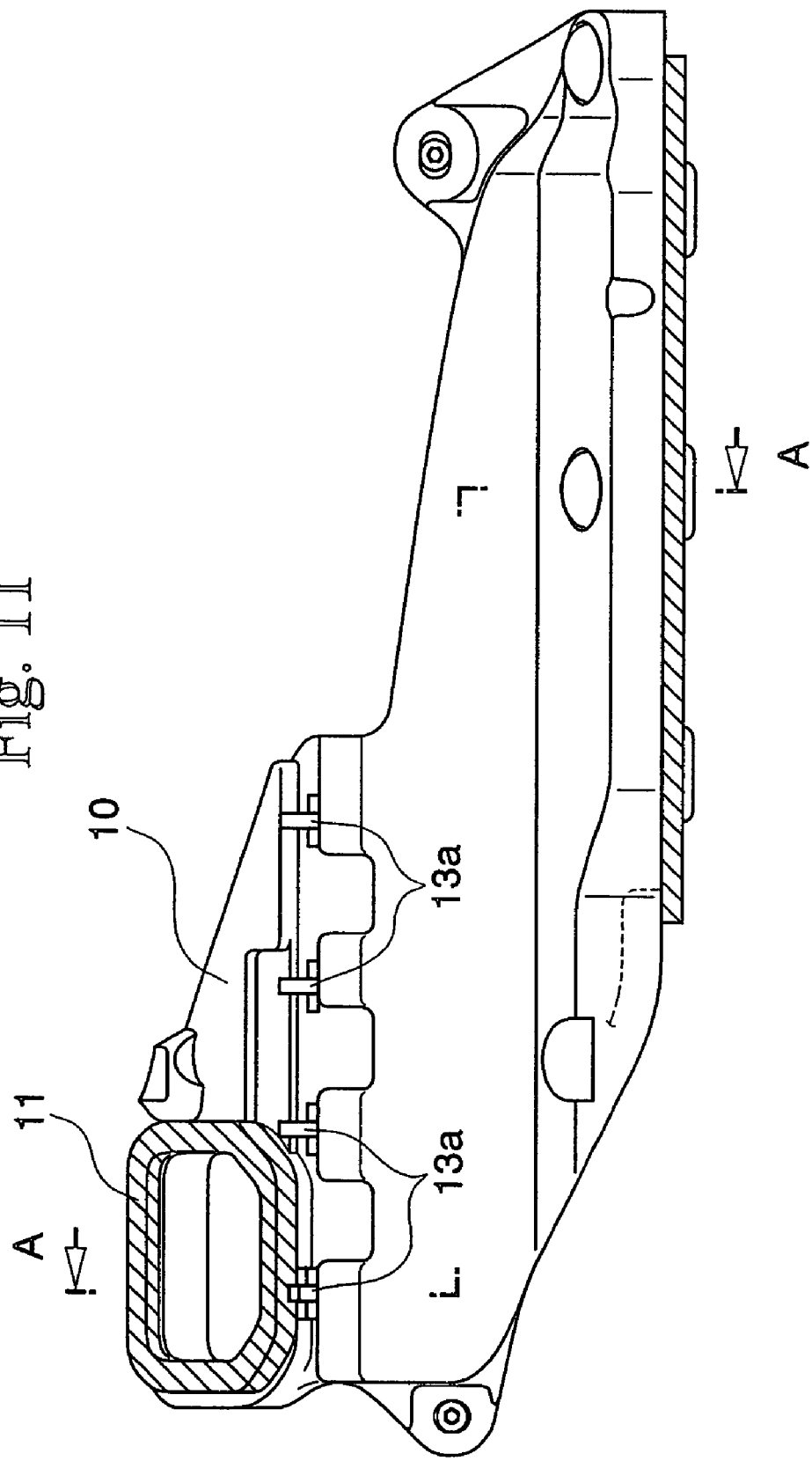
FIG. 11 is a component perspective view showing an enlargement of the area around the intake ducts of the high tension electrical equipment cooling device shown in FIG. 2.
Figure 12:
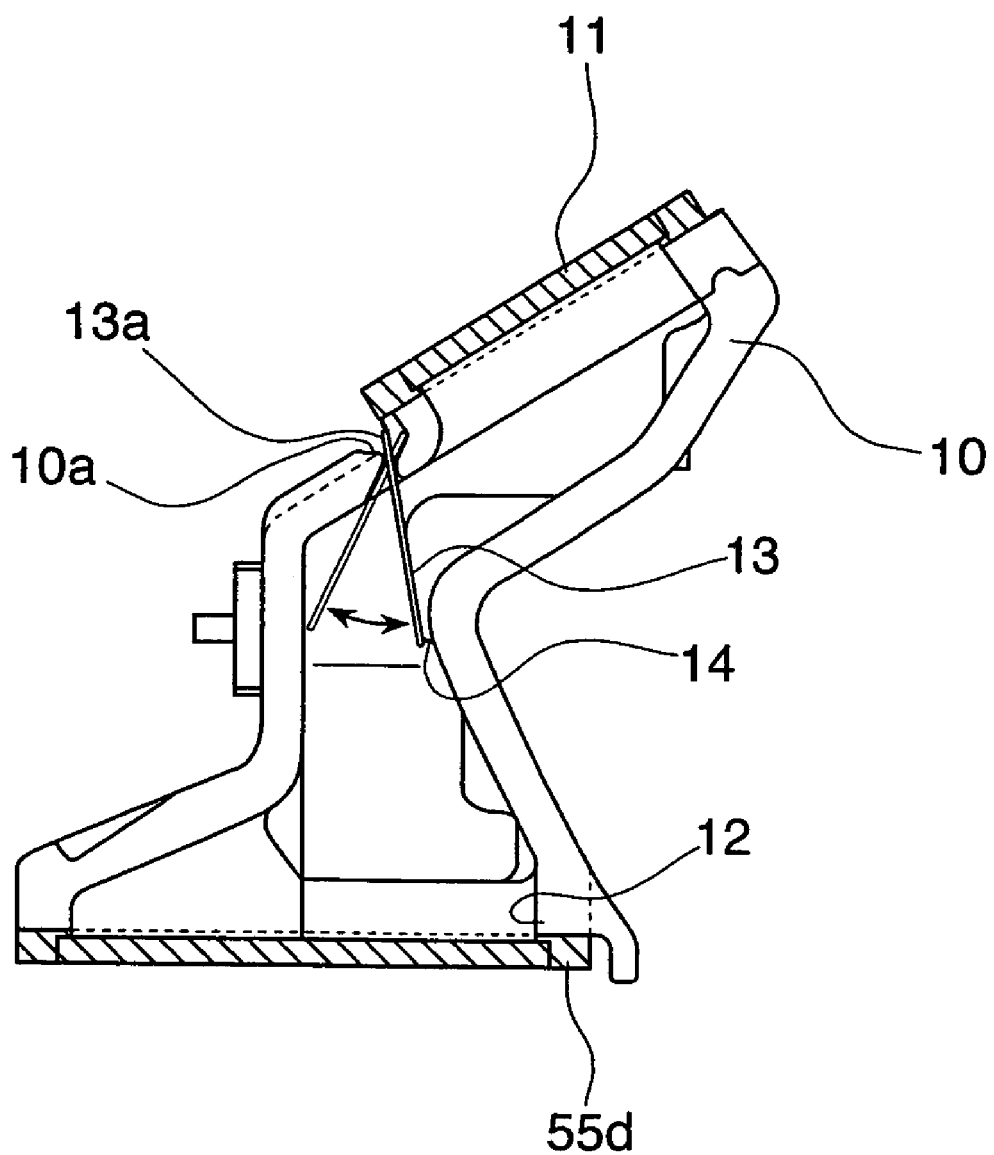
FIG. 12 is a cross-sectional view along the line A-A shown in FIG. 11.

FIG. 2 is a disassembled diagonal view of high tension electrical equipment cooling device 1 as seen from the front of the vehicle. FIG. 3 is a cross-sectional view of the same device. FIG. 4 is a front view of the same device as seen from the front of a vehicle. FIG. 5 is a front view of the same device, with a portion of the structure removed, as seen from the front of a vehicle. FIG. 6 is a rear view of the same device, as seen from the rear of the vehicle. FIG. 7 is a vertical cross-section through the battery housing area in the same device. FIG. 8 is an enlarged view of the components shown in FIG. 7. FIG. 9 is vertical cross-sectional view through the inverter housing in the same device. FIG. 10 is an enlarged view of the components shown in FIG. 9. FIG. 11 is a component perspective view showing an enlargement of the area around the intake duct 10 of the high tension electrical equipment cooling device 1. FIG. 12 is a cross-sectional view along the line A-A shown in FIG. 11. FIG. 13 is a planar view of the area around the intake duct 10 in the high tension electrical equipment cooling device 1 as seem from a position facing the cooling air inlet port 11. FIG. 14 is a lateral view of the shutter 13.

In this embodiment, as shown in FIGS. 7 and 9, the high tension electrical equipment cooling device 1 is disposed in between a rear seat 2 and trunk room 3 of the vehicle, and is inclined slightly toward the rear so as to lie along the back surface of the rear seat 2.

The high tension electrical equipment cooling device 1 is provided with the intake duct 10, battery box 20, heat sink case 30, exhaust duct 40, outer box 50 and fan 60.

The intake duct 10 and exhaust duct 40 are made of a foaming resin such as polypropylene foam which is lightweight and has high thermoinsulating properties.

As shown in FIGS. 2 and 7, the cooling air inlet port 11 is provided to the upper end of the intake duct 10, while the lower opening 12, which is longer and has a larger surface area than the cooling air inlet port 11, is provided to the lower end of the intake duct 10.

The cooling air inlet port 11 of the intake duct 10 is connected to an intake grill 4b via an opening 4a formed in a rear tray 4 of the vehicle, the intake grill 4b being disposed at this opening 4a. The intake grill 4b is provided with multiple intake openings 4c on the upper and side surfaces of the area exposed to the inside of the vehicle. Even if the intake openings 4c on the upper surface are blocked off due to placement of an object on top of the intake grill 4b, it is still possible for the air inside the vehicle to be introduced into the intake duct 10 from the intake openings 4c in the lateral surfaces.

Further, as described below, the shutter 13 is disposed near the cooling air inlet port 11 inside the intake duct 10. For example, the shutter 13 consisting of an elastic material such as EPDM rubber (ethylene propylene diene rubber) or the like is disposed so as to enable rotation around the upper portion thereof. Typically, it hangs down under its own weight and, as shown by the solid line in FIGS. 7 and 12, seals a flow route of cooling air by sitting on the valve seat 14 which is provided along the intake duct 10. When negative pressure is generated downstream from the shutter 13, the shutter 13 rotates upward and separates from the valve seat 14, opening the flow route of cooling air.

As shown in FIGS. 2, 6 and 9, the cooling air outlet 41 is provided behind the upper portion of the exhaust duct 40, and two lower openings 42 are provided to the bottom end of the exhaust duct 40. The fan 60 is provided at the cooling air outlet 41 for exhausting cooling air from inside the exhaust duct 40. The cooling air exhausted from the exhaust opening 61 of the fan 60 is expelled to the trunk room 3 via a duct not shown in figure.

The intake duct 10 and exhaust duct 40 are connected via the battery box 20, heat sink case 30 and outer box 50.

The battery box 20 is formed of a highly rigid material (such as a material formed by mixing 20% by weight fiberglass into polyacetal). As shown in FIGS. 3 and 7, the battery box 20 is in the form of a box having a plurality of upper openings 21 and lower openings 22 above and below. An inner space 23 of the battery box 20 forms a path through which cooling air flows, and also comprises a housing space in which a plurality of batteries 5 are attached. Cooling air flows into the inner space 23 of the battery box 20 from the upper openings 21, passes between the batteries 5, exchanging heat with them, and is then expelled to the outside of the battery box 20 from the lower opening 22.

Pairs of right and left fixing hubs 24, 25 are provided projecting out at the top front and bottom rear of the battery box 20. The top two fixing hubs 24, 24 are fixed in place to the rear tray 4 and its reinforcing member 4d by a bolt 26a as shown in FIGS. 7 and 8. The bottom two fixing hubs 25, 25 are fixed in place by the bolts 26b to a pipe frame 6a which is disposed lying along the direction of the width of the vehicle, inside the trunk room 3, as shown in FIGS. 6 and 7. The pipe frame 6a is fixed in place suspended between a pair of side frames 6b, 6b which are fixed in place on the right and left of a vehicle floor 6 inside the trunk room 3. The pipe frame 6a is disposed floating slightly higher than the vehicle floor 6. As a result, the battery box 20 is fixed in place to the body of the vehicle at two sites on the top front and at two sites on the bottom rear.

The heat sink case 30 is formed of a material that is highly rigid, such as aluminum. As shown in FIGS. 9 and 10, it is provided with a main body 31 in which two box-shaped cylinders 32, 32 extending vertically are disposed in parallel on the right and left and are connected in a unitary manner. The rear surface of the main body 31 is disposed in approximately the same plane as the rear surface of the battery box 20. Each attaching arm 33 extends in the forward direction from each of the top front side ends of the main body 31. The end of the attaching arm 33 forms fixing flanges 34 that is bent upward. The front surface of the fixing flange 34 is disposed in roughly the same plane as the front surface of the hubs 24 on the upper side of the battery box 20. This fixing flange 34 is fixed in place to the rear tray 4 and its reinforcing member 4d by a bolt 35a. In addition, a fixing hub 36 is provided to each of the bottom rear side ends of the main body 31. The fixing hub 36 is fixed in place by the bolt 35b to the pipe frame 6a. As a result, the heat sink case 30 is fixed in place to the body of the vehicle at two sites on its top front and at two sites on its bottom rear. It is therefore held very securely.

An inner space 32a of each cylinder 32 forms a path through which cooling air flows. A plurality of heat releasing plates (heat sinks) 37 are provided projecting upright from the front inner wall surface of the cylinder 32, extending in the vertical direction. A heat transmitting pedestal 38 is provided projecting out at the area where the heat releasing plate 37 of each cylinder is provided, which is the front outside wall of the main body 31. An attaching tray 39 is fixed in place at the heat transmitting pedestal 38 to approximately cover the front side of the main body 31. The upper end of the attaching tray 39 is disposed inside the attaching arm 33 and its lower end extends downward more than the main body 31.

As shown in FIGS. 3 and 5, an inverter 7 and DC/DC converter 8 are attached to attaching tray 39. The DC/DC converter 8 reduces the voltage converted from alternating to direct current at the inverter 7. Note that the symbol 7a in FIG. 9 indicates a hood which is attached to and covers the inverter 7. The peripheral edge of the hood 7a engages in the outside of the attaching tray 39. The inverter 7 is surrounded by the attaching tray 39 and hood 7a. A hood of identical structure and function is provided to the DC/DC converter 8. In a heat sink case 30 of this structure, the heat generated at the inverter 7 and DC/DC converter 8 is transmitted to the heat releasing plate 37 via the attaching tray 39, heat releasing pedestal 38, and cylinder 32. Heat exchange is carried out between the heat releasing plate 37 and the cooling air flowing through the inner space 32a of the cylinder 32.

The outer box 50 is in the shape of a box formed of thin metal. The battery box 20, heat sink case 30, inverter 7, and DC/DC converter 8 are housed within the outer box 50. As shown in FIG. 2, the outer box 50 is composed of a box-shaped main body 51, open over its entire front surface, and a lid 52 which seals the front opening of the main body 51. An opening 53 which is of approximately the same dimensions and shape as the upper opening 21 is formed at a position on the upper surface of the main body 51 corresponding to the upper opening 21 of the battery box 20 (see FIG. 8). In addition, an opening 54 which is of approximately the same dimensions and shape as the upper opening 32b is formed at a position on the upper surface of the main body 51 corresponding to the upper opening 32b of each cylinder 32 in the heat sink case 30 (see FIG. 10).

As shown in FIG. 10, the peripheral edge of the opening 54 in the outer box 50 is mounted on top of the peripheral edge of the upper opening 32b of the cylinder 32 in the heat sink case 30, with a seal member 55a held therebetween. In addition, the peripheral edge of the lower opening 42 in the exhaust duct 40 is mounted on top of the peripheral edge of the opening 54 in the outer box 50, with a seal member 55b held therebetween. By attaching the exhaust duct 40 to the heat sink case 30 with a bolt 43, the upper opening 32b of the heat sink case 30, the opening 54 of the outer box 50, and the lower opening 42 of the exhaust duct 40 are connected together in a sealed state.

As shown in FIG. 8, the peripheral edge of the opening 53 in the outer box 50 is mounted on top of the peripheral edge of the upper opening 21 in the battery box 20, with a seal member 55c held therebetween. In addition, the peripheral edge of the lower opening 12 in the intake duct 10 is mounted on top of the peripheral edge of the opening 53 in the outer box 50, with a seal member 55d held therebetween. By fixing the intake duct 10 in place to the battery box 20 by a fixing means not shown in figure, the upper opening 21 of the battery box 20, the opening 53 of the outer box 50, and the lower opening 12 of the intake duct 10 are connected together in a sealed state.

A flange 51a is provided to the peripheral edge of the front opening in the outer box 50. The periphery of the lid 52 is fixed in place to the flange 51a by screws 56. Note that the flange 51a is disposed in roughly the same plane as the front surface of the hub 24 at the upper portion of the battery box 20 and the front surface of the fixing flange 34 of the attaching arm 33 in the heat sink case 30. Cut-outs have been provided in the flange 51a to avoid interference between the hub 24 and fixing flange 34.

The lower end of the battery box 20 is separated from the bottom of the inner surface of the outer box 50 (see FIG. 7). The bottom end of the attaching tray 39 which is disposed to the heat sink case 30 and the lower end of the main body 31 of the heat sink case 30 are separated from the bottom of the inner surface of the outer box 50 (see FIG. 9). Inside the sealed outer box 50, the cooling air flow path 57 is formed communicating with the lower opening 22 of the battery box 20 and the lower opening 32c of the cylinder 32 in the heat sink case 30.

As shown in FIGS. 7 and 9, this outer box 50 is held in place between the fastener for the pipe frame 6a and the lower fixing hubs 25 in the battery box 20, and the fastener for the pipe frame 6a and the fixing hub 36 in the heat sink case 30. In addition, the lid 52 and lower flange 51a in the outer box 50 are fixed in place by means of a bolt 6d to a support frame 6c which is disposed along the width direction of the vehicle floor 6. As shown in FIG. 10, the outer box 50 is held in place between the heat sink case 30 and exhaust duct 40 at their area of fastening with the bolt 43. Note that in this embodiment, the outer box 50, battery box 20 and heat sink case 30 form the equipment box 70.

The shutter 13 which is disposed inside the intake duct 10 will now be explained with reference to FIGS. 11 through 14.

As shown in FIG. 14, the shutter 13 is formed as a plate consisting of an elastic material such as EPDM rubber (ethylene propylene diene rubber), and is provided with attaching parts 13a, . . . 13a, which engage in a releasable manner with attaching holes 10a, . . . 10a, provided in the intake duct 10, as shown in FIGS. 11 and 13, for example.

The attaching parts 13a, . . . 13a of the shutter 13 are inserted into the attaching holes 10a, . . . 10a so as to be directed outward from inside the intake duct 10, and attach so as to project outward in a perpendicular direction from the outer surface of the intake duct 10.

Each attaching part 13a of the shutter 13 is provided with, for example, a shaft 13b having a diameter roughly equal to the attaching hole 10a of the intake duct 10, and a projection 13c which widens at a suitable position along the shaft 13b. In addition, an expanded diameter portion 13d is provided in a direction perpendicular to the projection 13c for smoothly connecting the outer surface of the shaft 13b and the outer surface of projection 13c.

The projection 13c is for preventing the pulling out of the attaching part 13a which is attached in the attaching hole 10a. The expanded diameter portion 13d facilitates the insertion of the projection 13c into the attaching hole 10a, for example.

When the attaching part 13a in the attaching hole 10a, the attaching part 13a is firstly inserted into the attaching hole 10a. The inner peripheral surface of the attaching hole 10a then undergoes elastic deformation as it passes beyond the expanded diameter portion 13d and projection 13c, which have larger diameters than the attaching hole 10a diameter, with the attaching part 13a pulled out to the outside of the intake duct 10, for example. When the inner peripheral surface of the attaching hole 10a has passed over the projecting portion 13c, the pulling through of the attaching part 13a is complete. As a result, the attaching part 13a is fixed in place such that the periphery of the attaching hole 10a is held between the shutter main body 13e, and the projecting portion 13c and expanded portion 13d, which project beyond the attaching hole 10a.

The shutter 13 is structured to be able to rotate about the attaching part 13a which projects to the outside from the attaching hole 10a, or can be made to be elastically deformable. When the fan 60 is stopped, the shutter 13 settles on a valve seat 14 which is provided along the intake duct 10 by its own weight, and seals the cooling air flow route inside the intake duct 10.

When negative pressure is generated on the downstream side of the shutter 13, the shutter 13 rotates in the vertical direction under the wind pressure of the forcibly moved cooling air. Alternatively, the shutter 13 is elastically deformed and moves away from valve seat 14. As a result the shutter 13 opens the cooling air flow path inside the intake duct 10.

In the high tension electrical equipment cooling device 1 having this type of structure, negative pressure results inside the intake duct 10 when the fan 60 rotates. Accordingly, the shutter 13 rotates in the upward direction, moving away from the valve seat 14 and opening the flow path of cooling air. As a result, the air inside the vehicle is introduced as cooling air from the intake openings 4c of the intake grill 4b into the intake duct 10, and flows from the lower opening 12 of the intake duct 10 via the upper opening 21 of the battery box 20, into the inner space 23 of the battery box 20. The air then passes between the batteries 5 inside the inner space 23 and flows downstream. The air inside the vehicle which is flowing through the inner space 23 (hereinafter, referred to as "cooling air") undergoes heat exchange with the batteries 5. As a result, the batteries 5 are cooled and the cooling air undergoes a slight temperature increase due to heating. However, since the maintenance temperature of the batteries 5 is low, the extent of this increase in temperature is slight even when the cooling air temperature increases after heat exchange with batteries 5. Thus, the cooling air is of a sufficiently low temperature to cool the inverter 7 and DC/DC converter 8. The cooling air which cooled the batteries 5 is expelled to the inside of the outer box 50 from the lower opening 22 of the battery box 20.

Since the outer box 50 is sealed, and only the inner space 32a of the cylinders 32 in the heat sink case 30 serves as the flow path along which air can flow, the cooling air expelled from the battery box 20 into the outer box 50 passes along cooling air flow path 57, flows into the inner space 32a of the cylinder 32 from the lower opening 32c of the cylinders 32, passes between the heating plates 37 and rises up through the inner space 32a. The cooling air flowing through the inner space 32a undergoes heat exchange with the heating plate 37. As a result, the heating plate 37 is cooled, and the cooling air undergoes a rise in temperature with heating. Since the heat generated at the inverter 7 and DC/DC converter 8 is transmitted to the heating plates 37 inside the cylinders 32, the inverter 7 and DC/DC converter 8 are cooled by cooling of the heating plate 37.

The cooling air which has risen in temperature as a result of heat exchange with the heating plate 37 passes through the lower opening 42 of the exhaust duct 40 from the upper opening 32b of each cylinder 32 in the heat sink case 30, and is expelled into the exhaust duct 40. Furthermore, this cooling air is aspirated into the fan 60 from the cooling air outlet 41 of the exhaust duct 40. Then, the cooling air is expelled into the trunk room 3 from the exhaust outlet 61 of the fan 60 via a duct not shown in figure.

As described above, in the high tension electrical equipment cooling device 1 according to this embodiment, the shutter 13 closes off the air flow path of the intake grill 4b when the fan 60 is not rotating. Since the introduction of air from inside the vehicle via the cooling air inlet port 11 is prevented, it is possible to prevent warm air which has been heated inside the vehicle as a result of direct sunlight hitting the rear tray 4 when the vehicle is stopped, from entering the equipment box 70. Thus, excessive heating of the batteries 5, inverter 7, and DC/DC converter 8 can be prevented.

Moreover, it is possible to efficiently cool the high tension electrical equipment by means of a simple and inexpensive structure in which the shutter 13 consisting of the elastic material is provided.

Moreover, by forming the intake duct 10 using a foaming resin such as polypropylene foam which is lightweight and has high thermoinsulating properties, the thermoinsulating effects can be improved and the device can be made lighter in weight. Further, a greater degree of freedom with respect to shape can be achieved as compared to the case of blow molding, Note that the present invention is not limited to the embodiments described above.

For example, in the preceding embodiments, the cooling air was drawn in using the fan 60 that was provided downstream side of the equipment box 70. However, the fan 60 may also be disposed upstream side, for example, and the cooling air relayed under pressure to the equipment box 70.

In addition, the vehicle in the embodiment discussed above as a hybrid vehicle, however, the present invention may also be directed to an electric vehicle that runs on a motor alone.

What is claimed:

1. A high tension electrical equipment cooling device for a vehicle which cools a battery providing electricity to a driving motor via an inverter, and the inverter using cooling air, comprising:
    an equipment box having a cooling air intake port and a cooling air exhaust port, which houses the battery and the inverter therein;
    a fan adapted to introduce the cooling air through the cooling air intake port;
    a heat sink case provided behind a rear seat of the vehicle and in the equipment box;
    a heat sink provided in the heat sink case and adapted to cool the inverter; and
    a cooling air path provided behind the rear seat and in the equipment box, and adapted to introduce cooling air after cooling the battery to the heat sink case,
    wherein the high tension electrical equipment cooling device is adapted so that the cooling air which enters through the cooling air intake port passes through the battery, passes through the heat sink case via the cooling air path, and is exhausted from the cooling air exhaust port.

2. The high tension electrical equipment cooling device according to claim 1, wherein the cooling air is air in a cabin of the vehicle.

3. The high tension electrical equipment cooling device according to claim 1, further comprising:
    an opening and closing device adapted to allow and inhibit an entrance of the cooling air through the cooling air intake port.

4. A high tension electrical equipment cooling device for a vehicle which cools a battery providing electricity to a driving motor via an inverter, and the inverter using cooling air, comprising:
    an outer box having a cooling air intake port and a cooling air exhaust port;
    a battery box provided in the outer box and housing the battery;
    a heat sink case provided in the outer box and the inverter is mounted thereon;
    a heat sink provided in the heat sink case and adapted to cool the inverter;
    an intake duct connected with the cooling air intake port with a sealing and adapted to introduce the cooling air into the battery box;
    an exhaust duct connected with the cooling air exhaust port with a sealing and adapted to exhaust the cooling air through the heat sink case; and
    a fan adapted to introduce the cooling air through the cooling air intake ports,
    wherein the high tension electrical equipment cooling device is adapted so that the cooling air after passing through the battery box enters into the heat sink case via the inside of the outer case.

5. The high tension electrical equipment cooling device according to claim 4, wherein the battery box and the heat sink case is fixed on a body part of the vehicle.

* * * * *